(12) United States Patent
Lin et al.

(10) Patent No.: US 7,132,354 B2
(45) Date of Patent: Nov. 7, 2006

(54) INSPECTION METHODS FOR A SEMICONDUCTOR DEVICE

(75) Inventors: Long-Hui Lin, Hsinchu County (TW); Hsien-Te Lo, Taoyuan County (TW); Chia-Yun Chen, Kaohsiung County (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 0 days.

(21) Appl. No.: 11/213,931

(22) Filed: Aug. 30, 2005

(65) Prior Publication Data

US 2006/0134812 A1 Jun. 22, 2006

(30) Foreign Application Priority Data

Dec. 20, 2004 (TW) ............................... 93139616 A

(51) Int. Cl.
*H01L 21/3205* (2006.01)
(52) U.S. Cl. ............... 438/586; 438/720; 257/E21.008; 257/E21.508
(58) Field of Classification Search ............... 438/5, 438/7, 10, 11, 14, 16–18, 22–25, 29, 31, 34–36, 438/129, 130, 484, 538, 560–680, 720; 257/778, 257/698, 701, 703, 723, 724
See application file for complete search history.

(56) References Cited

U.S. PATENT DOCUMENTS

| | | | | |
|---|---|---|---|---|
| 6,235,620 B1* | 5/2001 | Saito et al. | ................. | 438/586 |
| 6,331,474 B1* | 12/2001 | Hayashi et al. | ............. | 438/476 |
| 6,528,387 B1* | 3/2003 | Moriyasu et al. | ........... | 438/404 |
| 6,753,253 B1* | 6/2004 | Takahashi et al. | .......... | 438/676 |
| 6,828,587 B1* | 12/2004 | Yamazaki et al. | ............ | 257/72 |
| 2004/0185672 A1* | 9/2004 | Polichar et al. | ............. | 438/720 |

* cited by examiner

*Primary Examiner*—Michael Lebentritt
*Assistant Examiner*—Andre' Stevenson
(74) *Attorney, Agent, or Firm*—Birch, Stewart, Kolasch & Birch, LLP

(57) ABSTRACT

An inspection method for a semiconductor device is disclosed. The method includes providing a semiconductor device, performing heat treatment on the semiconductor device, and inspecting the semiconductor device utilizing electron beam to acquire an analysis image. The semiconductor device comprises a substrate, a plurality of gate electrodes protruding on the substrate, a blanket dielectric layer overlying the substrate and gate electrodes, and a plurality of polycrystalline silicon plugs, respectively disposed on the substrate between the gate electrodes, in the dielectric layer. A piping defect is detected by the analysis image showing an area with voltage contrast difference.

18 Claims, 8 Drawing Sheets

INSPECTION METHODS FOR A SEMICONDUCTOR DEVICE

BACKGROUND

The invention relates to inspection technology and in particular to inspection of a piping defect inducing short circuit in a semiconductor device.

As the integrity of integrated circuits increases, the size of semiconductor device is reduced. In interconnection technology of an IC, for example, boron phosphosilicate tetra-ortho-silicate (BPTEOS) is typically utilized as a dielectric layer. When the line width is reduced to approximately 0.18 µm or less, piping defects occur frequently, negatively affecting the process yield.

FIGS. 1 through 3, 4A, and 4B show generation of a piping defect during an interconnection process for a semiconductor device.

In FIG. 1, first, a substrate 100, such as single crystalline silicon, comprising a transistor structure, is provided. The substrate 100 comprises a plurality of source/drain regions 132 individually arranged on an active surface of the substrate 100. The substrate 100 comprises isolation regions 110 respectively disposed between the source/drain regions 132 along direction Y in FIG. 1. The substrate 100 comprises a plurality of gate electrodes 120 protruding from the active surface thereof between the source/drain regions 132 along direction X in FIG. 1. The gate electrodes 120 typically comprise multi-layer structures comprising conductive layers as desired. The gate electrodes 120 comprise spacers 126 on sidewalls thereof, and thus, the exposed source/drain regions 132 between two spacers 126 of two neighboring gate electrodes 120 are typically less than 0.15 µm wide when the line width is reduced to approximately 0.18 µm or less by design rule of the semiconductor device.

In FIG. 2, a blanket dielectric layer 140, acting as a pre-metal dielectric layer, is formed overlying the substrate 100. The blanket dielectric layer 140 is shown transparently for subsequent description. A piping defect 145 extending across at least two source/drain regions 132 appears in dielectric layer 140 during formation thereof using BPTEOS when the design rule is reduced to less than about 0.18 µm.

In FIG. 3, the dielectric layer 140 is patterned to form vias 142 exposing the source/drain regions 132. Simultaneously, the former piping defect 145 becomes piping defect 145' connecting two neighboring vias 142.

In FIG. 4A and FIG. 4B, cross-sections along line AA in FIG. 4A, the vias 142 are respectively filled with a conductive layer, and thus, plugs 162a through 162c are formed respectively connecting to the corresponding source/drain regions 132. Simultaneously, the piping defect 145' is also filled with the conductive layer. Thus, the plugs 162a and 162b, intended to be electrically isolated by the isolation regions 110 and dielectric layer 140 in design, bridge via the piping defect 145', inducing short circuit.

The piping defect 145' cannot be identified by naked eye or optical microscope due to typically deep embedment in the dielectric layer 140. Conventionally, the piping defect 145' is detected by wafer probing after completion of the wafer fabrication process. Alternatively, the piping defect 145' can be detected by sample destructive testing after formation of the dielectric layer. The destructive testing is performed by removal of the dielectric layer 140 to expose the plugs 162a through 162c utilizing an etchant or etch method with high etch selectivity of the dielectric layer 140 to the plugs 162a through 162c. Thus, the piping defects between the plugs 162a through 162c are identified by SEM.

The period between the formation of the conductive layer and wafer probing, however, can be between two and three months. Discovery of piping defects in wafer probing indicates occurrence of the piping defect potentially during the two to three months, affecting the process yield. Further, shutdown, check, and repair of the production line, and overall inspection for the products are required, and thus, internal failure cost increases substantially.

When destructive testing is performed, the sampling unit is per piece of wafer. These sacrificed wafers increase the product loss.

SUMMARY

Inspection methods for a semiconductor device are provided.

An embodiment of an inspection method for a semiconductor device comprises providing a semiconductor device on which heat treatment is performed. The semiconductor device is inspected utilizing electron beam to acquire an analysis image. The semiconductor device comprises a substrate, a plurality of gate electrodes protruding on the substrate, a blanket dielectric layer overlying the substrate and gate electrodes, and a plurality of polycrystalline silicon plugs, respectively disposed on the substrate between the gate electrodes, in the dielectric layer. A piping defect is detected by the analysis image showing an area with voltage contrast difference.

An embodiment of an inspection method for a semiconductor device comprises providing a semiconductor device on which heat treatment is performed. The semiconductor device is inspected utilizing electron beam to acquire an analysis image. The semiconductor device comprises a substrate, a dielectric layer overlying the substrate, and a plurality of polycrystalline silicon layers electrically isolated by the dielectric layer. A piping defect is detected by the analysis image showing an area with voltage contrast difference.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE DRAWINGS

The present invention will become more fully understood from the subsequent detailed description and the accompanying drawings, which are given by way of illustration only, and thus are not limitative of the present invention, and wherein.

DETAILED DESCRIPTION

Inspection methods for a semiconductor device are provided and described in greater detail in the following.

Figure 5:
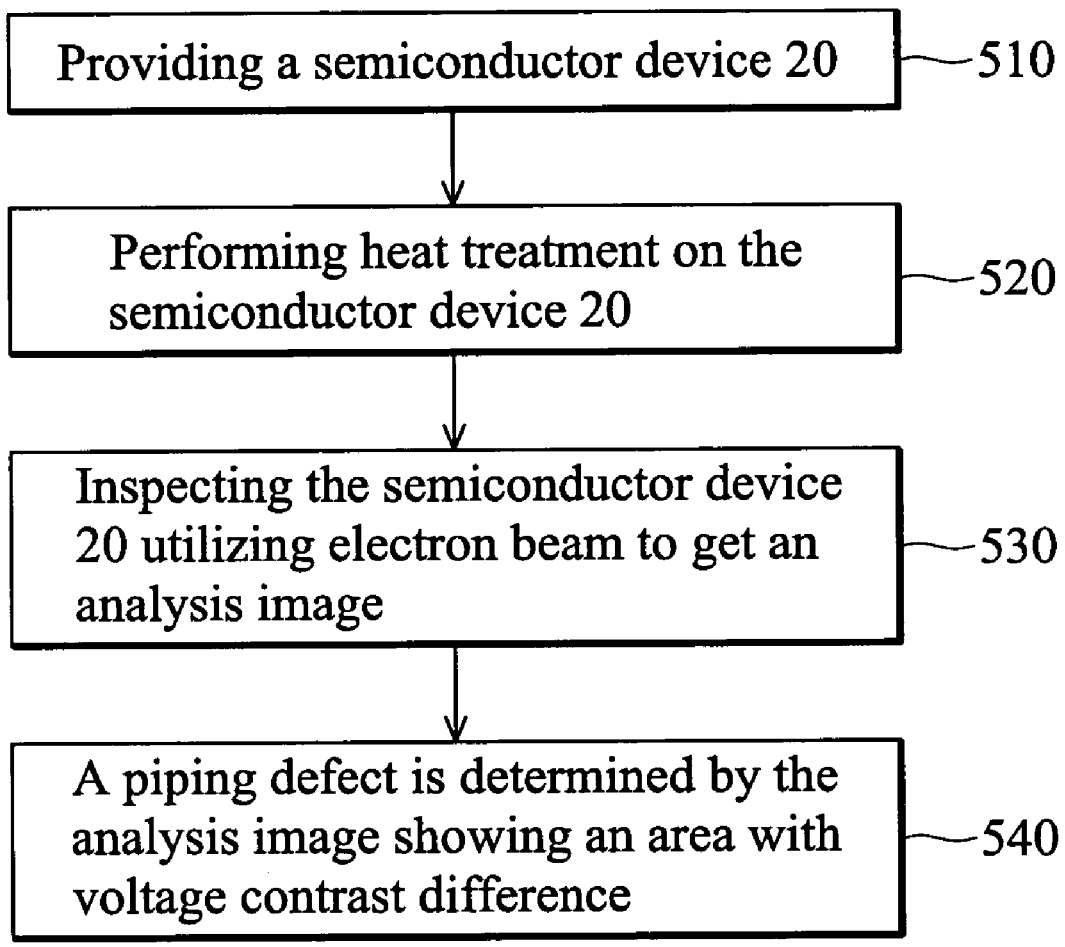
FIG. 5 is a flowchart of an inspection method for a semiconductor device of an embodiment of the invention.
Figure 6A:
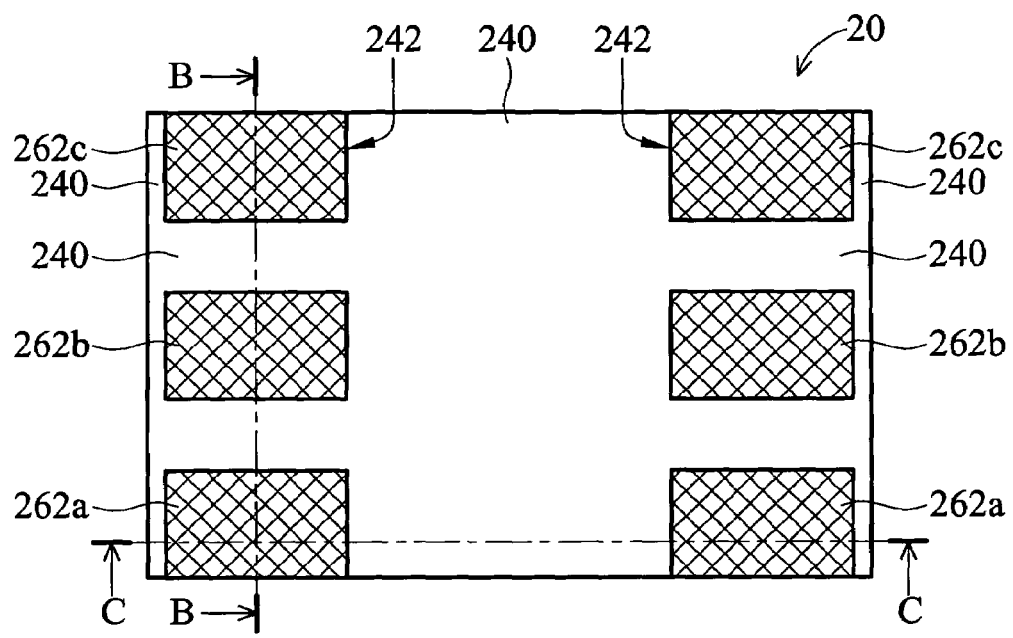
FIG. 6A is a top view of a semiconductor device of an inspection method for a semiconductor device of an embodiment of the invention.

Referring to FIG. 5, a flowchart of an inspection method for a semiconductor device of an embodiment of the invention, in a step 510, a semiconductor device shown in FIG. 6A, for example, is provided.

Figure 6B:
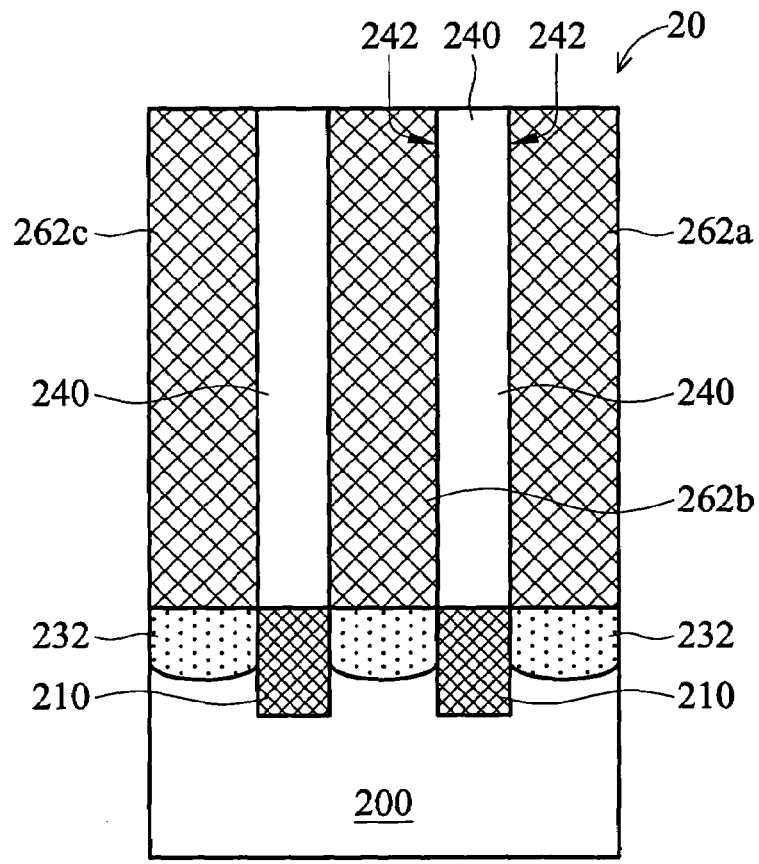
FIG. 6B is a cross-section of an exemplary embodiment along line BB in FIG. 6A.
Figure 6C:
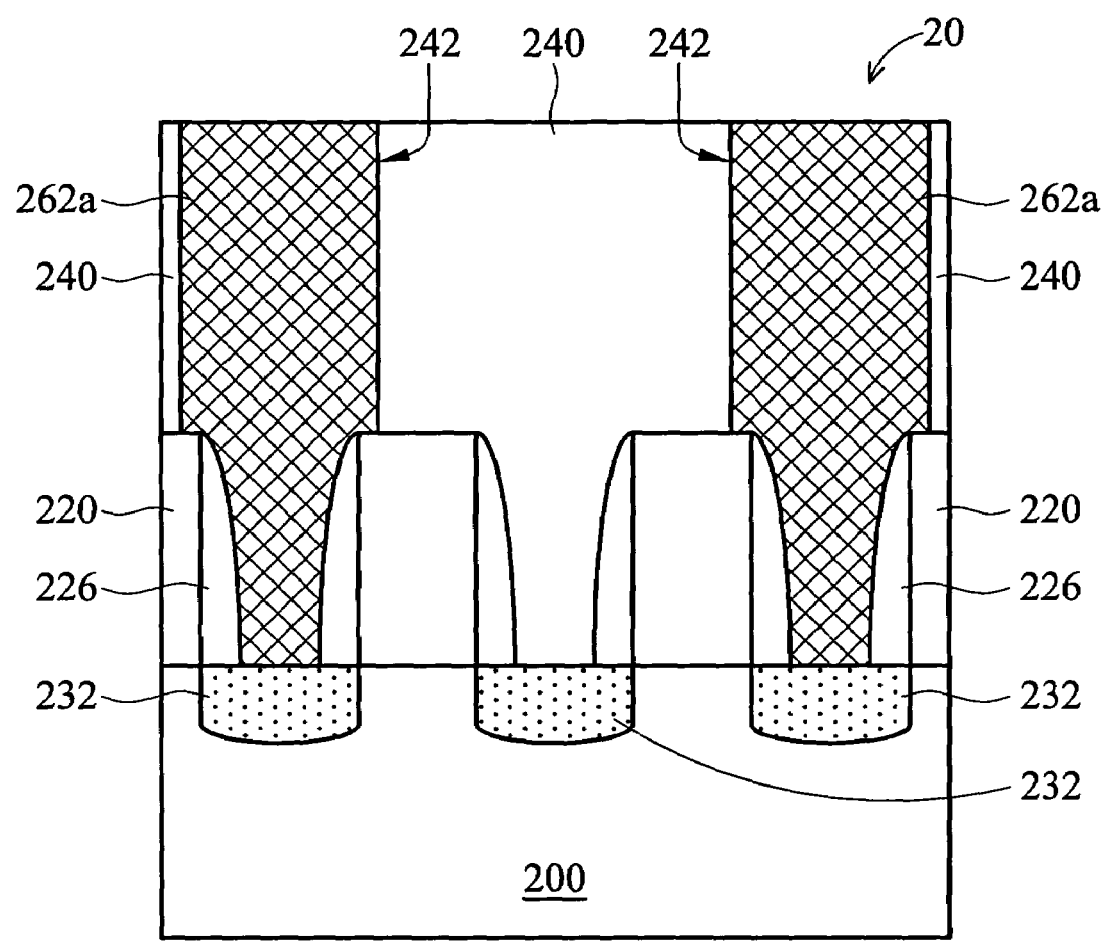
FIG. 6C is a cross-section of an exemplary embodiment along line CC in FIG. 6A.

As shown in FIG. 6A, the semiconductor device 20 comprises a substrate 200, a dielectric layer 240 and a plurality of poly-crystalline silicon layers 262a through 262c individually isolated by the dielectric layer 240. In one embodiment, the semiconductor device 20 comprises a transistor as shown in FIGS. 6B and 6C, respective cross-sections along lines BB and CC in FIG. 6A. In FIGS. 6B and 6C, the semiconductor device 20 comprises a plurality of source/drain regions 232 individually arranged on an active surface of the substrate 200. In FIGS. 6A and 6B, the substrate 200 comprises isolation regions 210 respectively disposed between the source/drain regions 232 along direction Y in FIG. 6A, and a plurality of gate electrodes 220 protruding from the active surface thereof between the source/drain regions 232 along direction X in FIG. 6A. The gate electrodes 220 typically comprise multi-layer structure comprising conductive layers as desired. The gate electrodes 220 comprise spacers 226 on sidewalls thereof. A blanket dielectric layer 240 is formed overlying the substrate 200. The dielectric-layer 240 comprises a plurality of openings 242 exposing the source/drain regions 232. The poly-crystalline silicon layers 262a through 262c are filled in the openings 242 for disposition in the dielectric layer 240. In this embodiment, the openings 242 act as vias and the poly-crystalline silicon layers 262a through 262c act as plugs. When the dielectric layer 240 is free of piping defects, the poly-crystalline silicon layers 262a through 262c are electrically isolated by the dielectric layer 240.

Figure 6D:
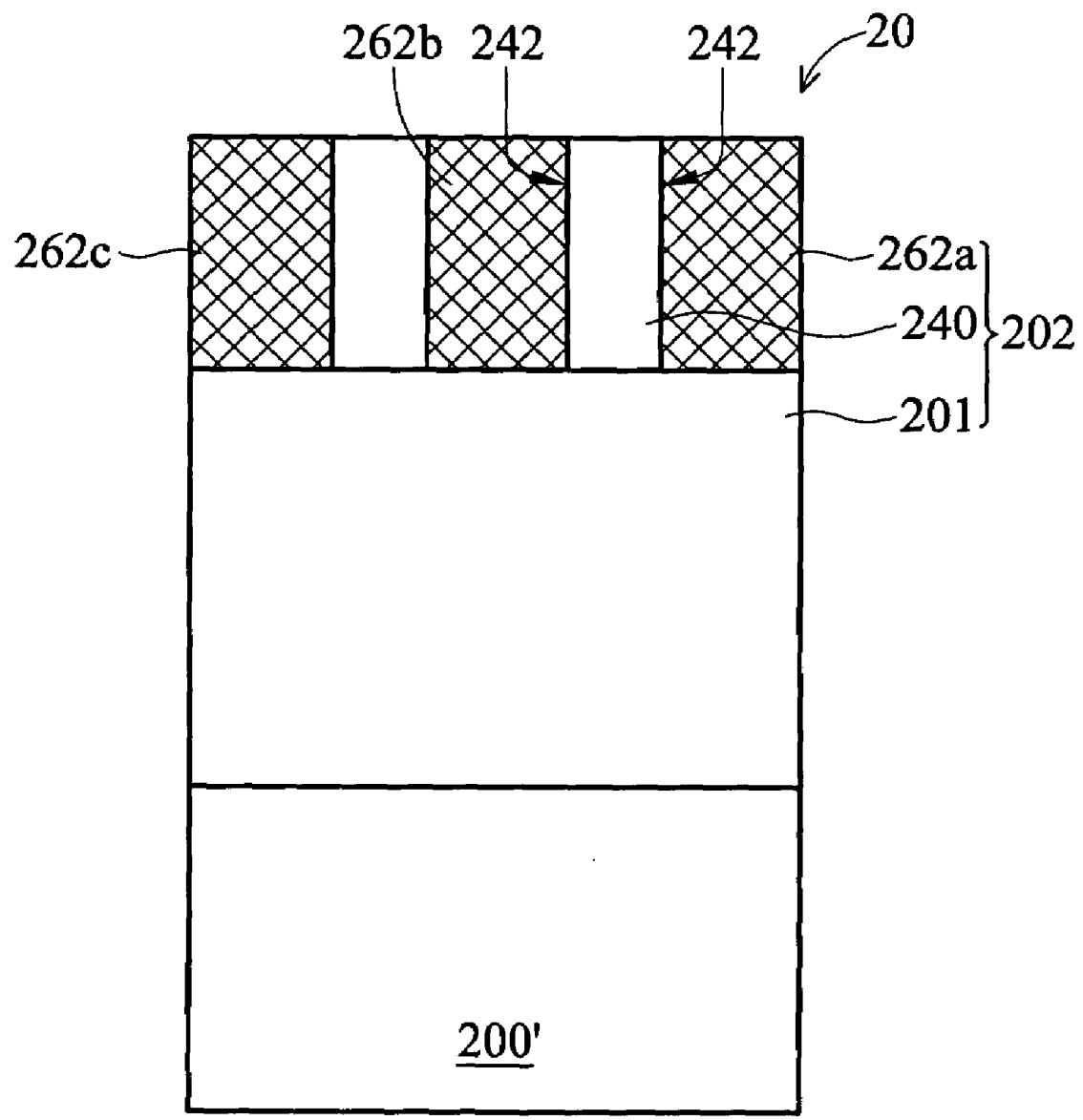
FIG. 6D is a cross-section of another exemplary, embodiment along line BB in FIG. 6A.
Figure 6E:
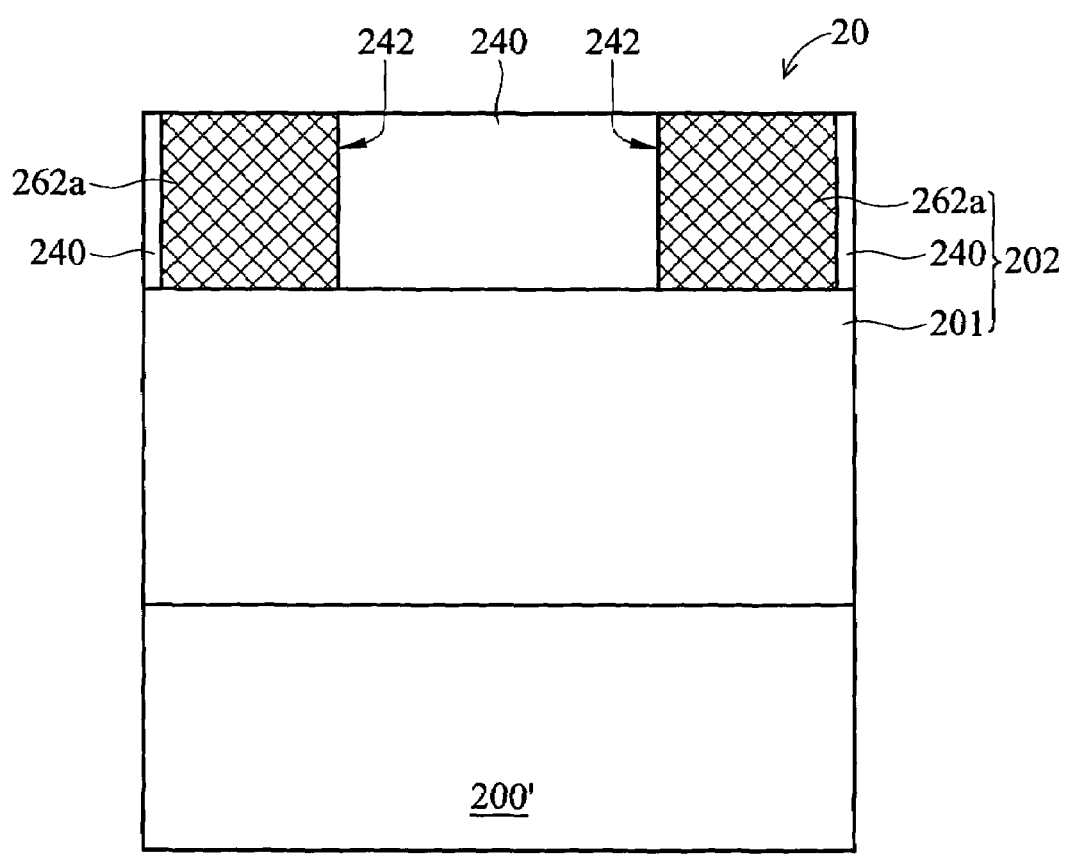
FIG. 6E is a cross-section of another exemplary embodiment along line CC in FIG. 6A.

In another embodiment, the semiconductor device 20 comprises substrate 200' and lamination 202 overlying the substrate 200' shown in FIGS. 6D and 6E, cross-sections respectively along lines BB and CC. The lamination 202 comprises at least two, but three, in this embodiment, polycrystalline silicon layers 262a through 262c, individually isolated by a dielectric layer 240. The lamination 202 may comprise an optional interconnection layer 201 between the substrate 200' and the dielectric layer 240. The substrate 200' may further comprise a transistor, equivalent to the description for FIGS. 6B and 6C, and thus, omitted herefrom. The dielectric layer 240, overlying the substrate 200' and the optional interconnection layer 201, comprises through openings 242 respectively filled with the polycrystalline silicon layers 262a through 262c. When the dielectric layer 240 is free of piping defects, the poly-crystalline silicon layers 262a through 262c are electrically isolated by the dielectric layer 240.

Next, step 520 as shown in FIG. 5 is performed, in which semiconductor device 20 is thermally treated by a heating apparatus (not shown), such as a furnace, generating an analysis image with better contrast after the subsequent electron beam inspection. The heat treatment is preferably performed between 620 and 1000° C., and more preferably between 700 and 950° C., depending on statement of the poly crystalline silicon layers 262a through 262c for more apparent improvement for the contrast of the analysis image. The heat treatment is preferably performed for between 1 and 60 minutes, and more preferably between 5 and 25 minutes for further apparent improvement of the contrast of the analysis image. A chemical mechanical polishing procedure can be further performed on the semiconductor device 20 to planarize the dielectric layer 240 and the polycrystalline silicon layers 262a through 262c prior to the heat treatment.

Next, step 530 as shown in FIG. 5 is performed. For example, the semiconductor device 20 can be placed in a relative vacuum environment, and receive an electron beam (not shown) generated by an electron beam generator (not shown). Simultaneously, it is preferred to collect signals of secondary electrons to acquire an analysis image. During the electron beam inspection in a mode such as an extraction mode, landing energy of the electron beam is preferably between 200 and 600 eV, intermediate energy of the electron beam is preferably between 600 and 1000 eV, and the inspection pixel is preferably between 0.05 and 0.15 μm.

Figure 1:
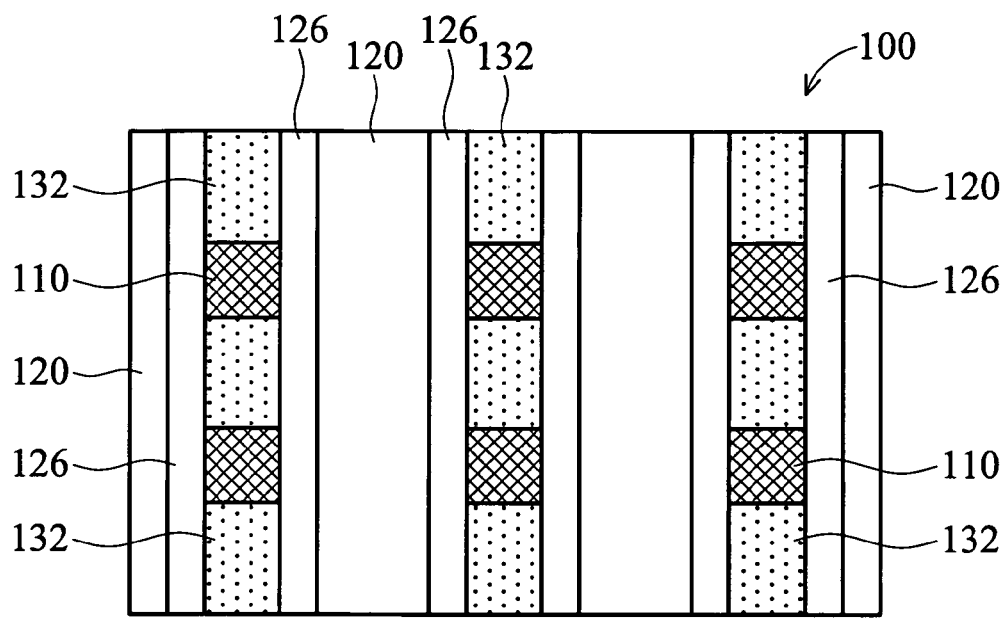
FIG. 1 is a top-view of occurrence of a piping defect during an interconnection process for a semiconductor device.
Figure 2:
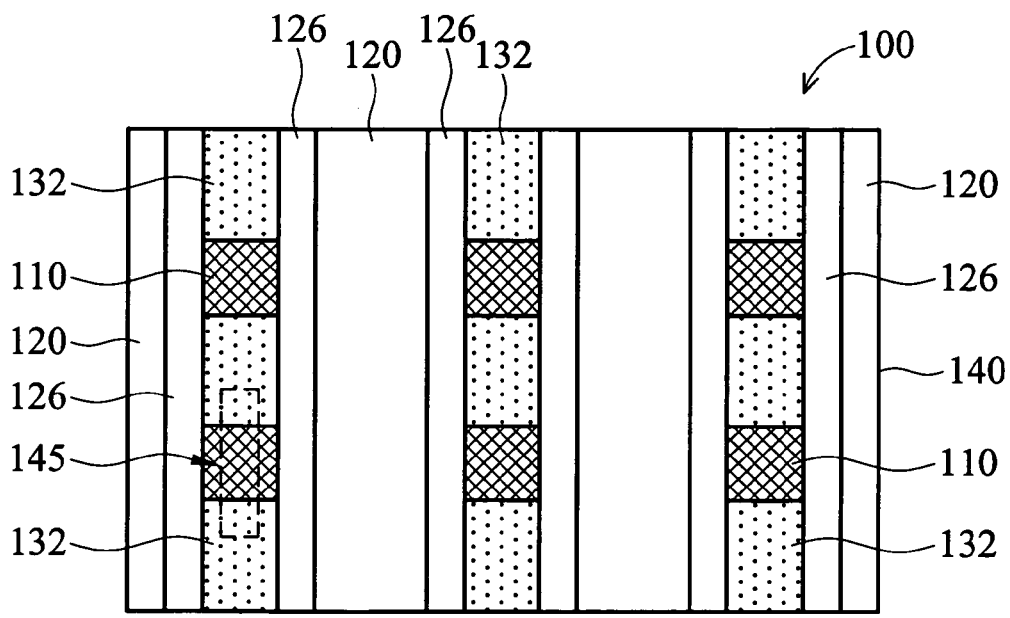
FIG. 2 is a top view of occurrence of a piping defect during an interconnection process for a semiconductor device.
Figure 3:
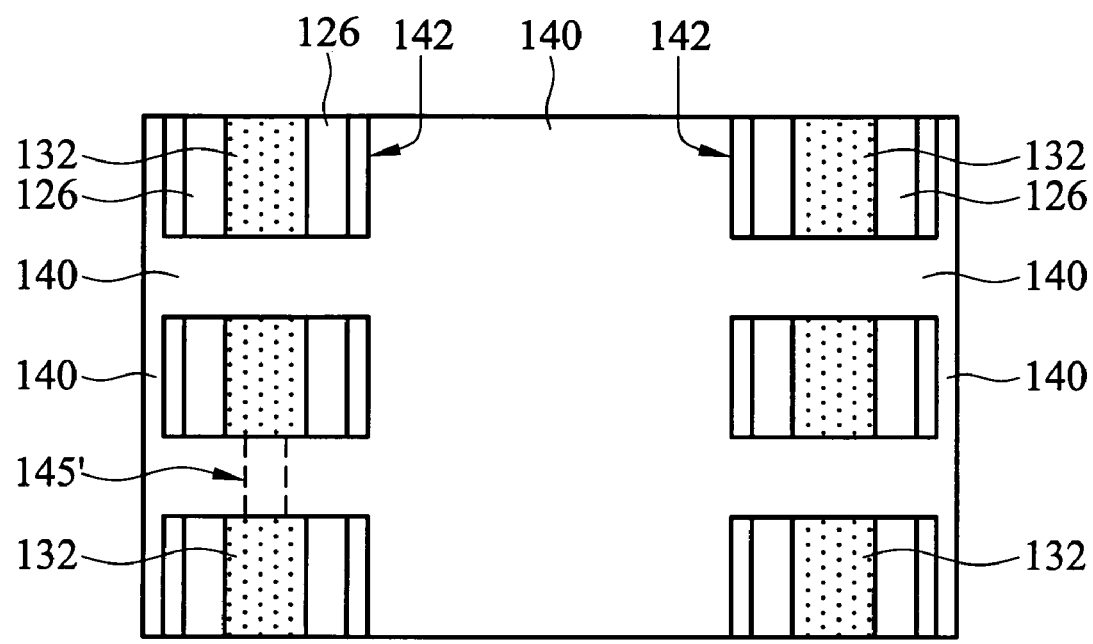
FIG. 3 is a top view of occurrence of a piping defect during an interconnection process for a semiconductor device.
Figure 4A:
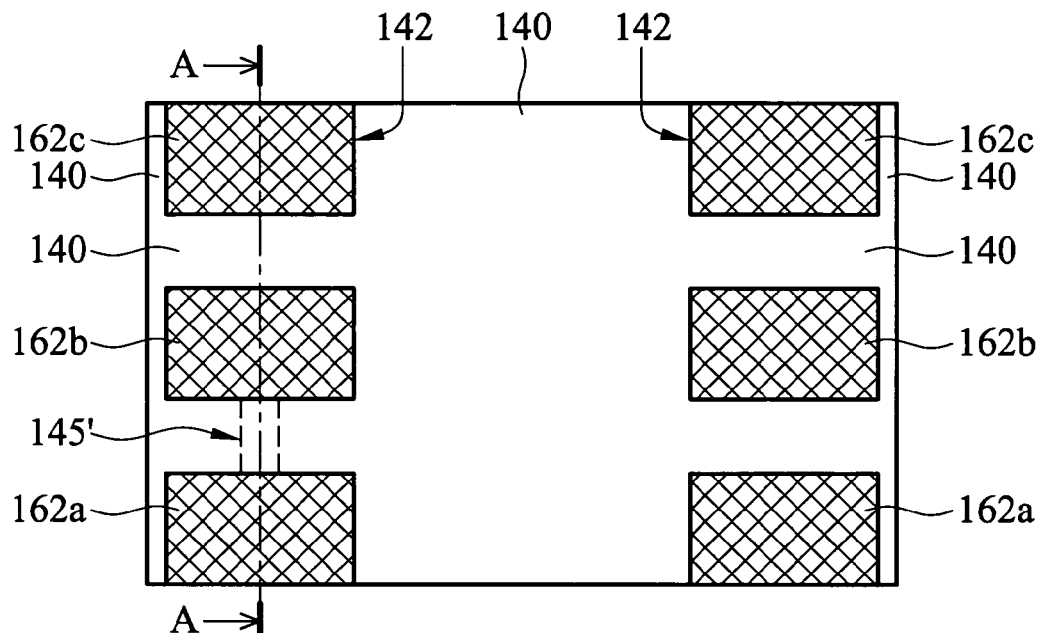
FIG. 4A is a top view of occurrence of a piping defect during an interconnection process for a semiconductor device.
Figure 4B:
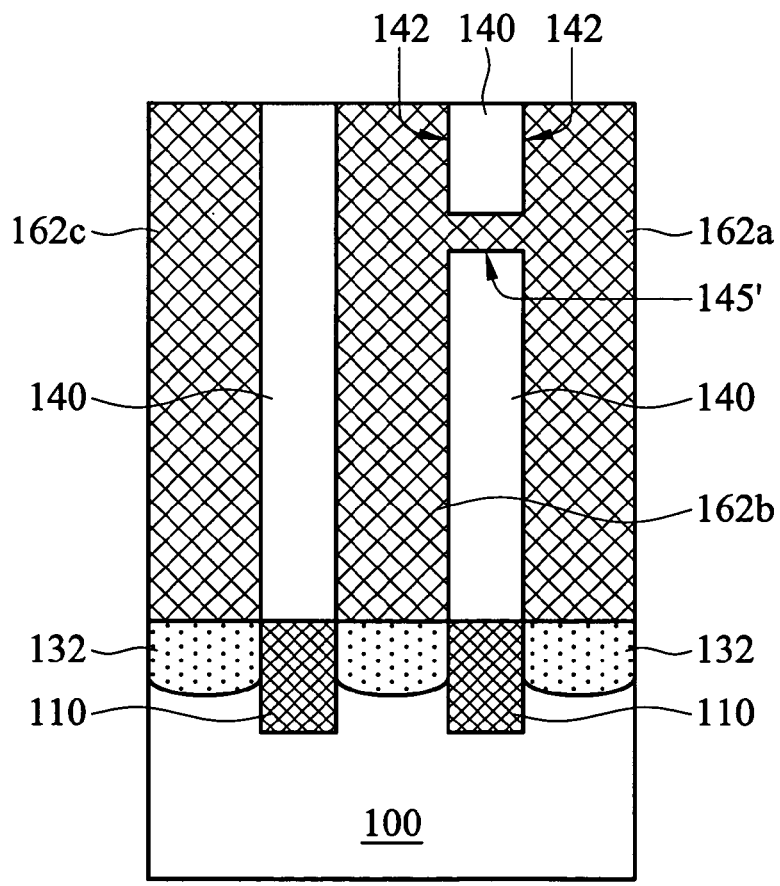
FIG. 4B is a cross-section along line AA in FIG. 4A.

Finally, the analysis image is interpreted during a step 540 in FIG. 5. When a piping defect such as that shown in FIGS. 4A and 4B is induced in the semiconductor device 20, charge distribution of the polycrystalline silicon layers 262a through 262c bridged via the piping defect is different from the electrically isolated polycrystalline silicon layers 262a through 262c during a first stage of the irradiation of the electron beam. Thus, area corresponding to the bridged polycrystalline silicon layers 262a through 262c in the analysis image shows a voltage contrast difference. That is, brightness of the area corresponding to the bridged polycrystalline silicon layers 262a through 262c is different from the background brightness of the analysis image. The area corresponding to the bridged polycrystalline silicon layers 262a through 262c is brighter or darker than the background of the analysis image depending on modes of the analysis image. In this embodiment, the area corresponding to the bridged polycrystalline silicon layers 262a through 262c is brighter than the background of the analysis image in an extraction mode. A piping defect is revealed by the analysis image showing an area with voltage contrast difference.

Destructive testing can be performed on the tested semiconductor device to verify the performance of embodiments of inspection methods of the invention. The dielectric layer of the tested semiconductor device is removed by selective etching. The remaining polycrystalline silicon layers are inspected by SEM, and thus, the piping defects bridging two or more of the polysilicon layers 262a/262b/262c can be located. In this embodiment, after the destructive testing, the piping defects are observed in areas corresponding to brighter areas in the analysis image in an extraction mode, but not observed in other areas. Thus, performance of the inventive methods is verified.

The results show the efficacy of the inventive inspection methods for a semiconductor device in determining piping defects in a dielectric layer intermediately after formation of the dielectric layer, without sacrifice of any semiconductor devices, thus improving the process yield and lowering internal failure cost.

While the invention has been described by way of example and in terms of preferred embodiment, it is to be understood that the invention is not limited thereto. It is therefore intended that the following claims be interpreted as covering all such alteration and modifications as fall within the true spirit and scope of the invention.

What is claimed is:

1. An inspection method for a semiconductor device, comprising:
providing a semiconductor device comprising a substrate, a plurality of gate electrodes protruding from the substrate, a blanket dielectric layer overlying the substrate and gate electrodes, and a plurality of polycrystalline silicon plugs, respectively disposed on the substrate between the gate electrodes, in the dielectric layer;
performing heat treatment on the semiconductor device; and
inspecting the semiconductor device utilizing electron beam to acquire an analysis image;
wherein a piping defect, electrically connecting at least two of the polycrystalline silicon plugs, is determined by the analysis image showing an area with voltage contrast difference.

2. The method as claimed in claim 1, wherein the heat treatment is performed between 620 and 1000° C.

3. The method as claimed in claim 1, wherein the heat treatment duration is between 1 and 60 minutes.

4. The method as claimed in claim 1, wherein the piping defect is detected by the analysis image showing an area with brightness different from background brightness of the image.

5. The method as claimed in claim 1, wherein the piping defect is detected by the analysis image showing an area brighter than background of the image in extracting mode.

6. The method as claimed in claim 1, further comprising chemical mechanical polishing the semiconductor device prior to inspecting the semiconductor device.

7. The method as claimed in claim 1, wherein landing energy of the electron beam during inspection is between 200 and 600 eV.

8. The method as claimed in claim 1, wherein intermediate energy of the electron beam during inspection is between 600 and 1000 eV.

9. The method as claimed in claim 1, wherein inspection pixel during ion beam inspection is between 0.05 and 0.15 μm.

10. An inspection method for a semiconductor device, comprising:
providing a semiconductor device comprising a substrate, a dielectric layer overlying the substrate, and a plurality of polycrystalline silicon layers electrically isolated by the dielectric layer;
performing heat treatment on the semiconductor device; and
inspecting the semiconductor device utilizing electron beam to acquire an analysis image;
wherein a piping defect, electrically connects at least two of the polycrystalline silicon layers, is detected by the analysis image showing an area with voltage contrast difference.

11. The method as claimed in claim 10, wherein the heat treatment is performed between 620 and 1000° C.

12. The method as claimed in claim 10, wherein the heat treatment duration is between 1 and 60 minutes.

13. The method as claimed in claim 10, wherein the piping defect is detected by the analysis image showing an area with brightness different from background brightness of the image.

14. The method as claimed in claim 10, wherein the piping defect is detected by the analysis image showing an area brighter than background of the image in extracting mode.

15. The method as claimed in claim 10, further comprising chemical mechanical polishing the semiconductor device prior to inspecting the semiconductor device.

16. The method as claimed in claim 10, wherein landing energy of the electron beam during inspection is between 200 and 600 eV.

17. The method as claimed in claim 10, wherein intermediate energy of the electron beam during inspection is between 600 and 1000 eV.

18. The method as claimed in claim 10, wherein inspection pixel during ion beam inspection is between 0.05 and 0.15 μm.

* * * * *